(12) United States Patent
Sheikh et al.

(10) Patent No.: US 10,984,863 B2
(45) Date of Patent: Apr. 20, 2021

(54) ERROR DETECTION AND CORRECTION CIRCUITRY

(71) Applicant: Arm Limited, Cambridge (GB)

(72) Inventors: Mohammed Saif Kunjatur Sheikh, Bangalore (IN); Vikash, Bangalore (IN); Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 287 days.

(21) Appl. No.: 15/959,048

(22) Filed: Apr. 20, 2018

(65) Prior Publication Data
US 2019/0325962 A1    Oct. 24, 2019

(51) Int. Cl.
G11C 15/04 (2006.01)
G11C 29/42 (2006.01)
G06F 11/10 (2006.01)

(52) U.S. Cl.
CPC .......... *G11C 15/04* (2013.01); *G06F 11/1004* (2013.01); *G06F 11/1064* (2013.01); *G11C 29/42* (2013.01)

(58) Field of Classification Search
CPC ..... G11C 15/04; G11C 29/42; G06F 11/1064; G06F 11/1004
USPC ....... 714/723, 718, 719, 742, 758, 763, 766, 714/773, 800
See application file for complete search history.

(56) References Cited

U.S. PATENT DOCUMENTS

| | | | | |
|---|---|---|---|---|
| 6,240,485 B1 * | 5/2001 | Srinivasan | ............. | G11C 15/00 365/49.17 |
| 6,246,601 B1 * | 6/2001 | Pereira | .................... | G11C 15/00 365/189.16 |
| 6,252,789 B1 * | 6/2001 | Pereira | ............. | G06F 16/90339 365/49.18 |
| 6,348,881 B1 * | 2/2002 | Buer | ................... | H03M 7/3084 341/106 |
| 6,381,673 B1 * | 4/2002 | Srinivasan | ............. | G11C 15/00 365/49.18 |
| 6,393,514 B1 * | 5/2002 | Khanna | .................. | G11C 15/00 710/57 |
| 6,418,042 B1 * | 7/2002 | Srinivasan | ............. | G11C 15/00 365/49.17 |
| 6,460,112 B1 * | 10/2002 | Srinivasan | ............. | G11C 15/04 365/168 |

(Continued)

OTHER PUBLICATIONS

Li, Testing Priority Address Encoder Faults of Content Addressable Memories, 2005, IEEE, pp. 1-8. (Year: 2005).*

(Continued)

*Primary Examiner* — John J Tabone, Jr.
(74) *Attorney, Agent, or Firm* — Pramudji Law Group PLLC; Ari Pramudji

(57) ABSTRACT

Various implementations described herein are directed to an integrated circuit having an array of bitcells. The integrated circuit may include latch circuitry having a latch for each row of bitcells that latches valid match data into the latch for each row of bitcells. The integrated circuit may include priority encoding circuitry that receives the valid match data from the latch for each row of bitcells. The integrated circuit may include first logic circuitry coupled between the array of bitcells and the priority encoding circuitry to assist with providing the valid match data to the latch circuitry.

19 Claims, 8 Drawing Sheets

300

Hamming Code Implementation for Parity Bit Coverage

| Bit Position | | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| Encoded Data Bits | | p1 | p2 | d1 | p4 | d2 | d3 | d4 | p8 | d5 | d6 | d7 | d8 | d9 | d10 | d11 | p16 | d12 | d13 | d14 | d15 |
| Parity Bit Coverage | p1 | X | | X | | X | | X | | X | | X | | X | | X | | X | | X | |
| | p2 | | X | X | | | X | X | | | X | X | | | X | X | | | X | X | |
| | p4 | | | | X | X | X | X | | | | | X | X | X | X | | | | | X |
| | p8 | | | | | | | | X | X | X | X | X | X | X | X | | | | | |
| | p16 | | | | | | | | | | | | | | | | X | X | X | X | X |

(56) References Cited

U.S. PATENT DOCUMENTS

| | | | | |
|---|---|---|---|---|
| 6,542,391 B2* | 4/2003 | Pereira | G11C 15/00 | 365/49.15 |
| 6,574,702 B2* | 6/2003 | Khanna | G11C 15/04 | 365/189.07 |
| 6,661,686 B1* | 12/2003 | Srinivasan | G11C 15/00 | 365/189.05 |
| 6,728,124 B1* | 4/2004 | Ichiriu | G11C 15/00 | 365/189.07 |
| 6,842,360 B1* | 1/2005 | Srinivasan | G11C 15/04 | 365/189.07 |
| 6,856,527 B1* | 2/2005 | Srinivasan | G11C 15/04 | 365/104 |
| 6,865,098 B1* | 3/2005 | Ichiriu | G11C 15/00 | 365/189.07 |
| 6,892,272 B1* | 5/2005 | Srinivasan | G11C 15/04 | 365/168 |
| 6,920,525 B2* | 7/2005 | Chadwick | G11C 15/00 | 365/200 |
| 7,002,823 B1* | 2/2006 | Ichiriu | G06F 11/1064 | 365/189.04 |
| 7,043,673 B1* | 5/2006 | Ichiriu | G11C 15/00 | 714/719 |
| 7,133,302 B1* | 11/2006 | Srinivasan | G11C 15/04 | 365/49.1 |
| 7,174,419 B1* | 2/2007 | Ichiriu | G11C 15/00 | 365/49.1 |
| 7,230,841 B1* | 6/2007 | Srinivasan | G11C 15/04 | 365/189.05 |
| 7,254,748 B1* | 8/2007 | Wright | G06F 11/1064 | 711/108 |
| 7,257,763 B1* | 8/2007 | Srinivasan | G06F 11/1064 | 714/718 |
| 7,283,380 B1* | 10/2007 | Srinivasan | G11C 15/04 | 365/189.07 |
| 7,428,672 B2* | 9/2008 | Kaginele | G11C 29/56 | 365/200 |
| 7,487,200 B1* | 2/2009 | Srinivasan | G11C 8/04 | 370/392 |
| 8,462,532 B1* | 6/2013 | Argyres | G11C 15/04 | 365/154 |
| 8,553,441 B1* | 10/2013 | Argyres | G11C 15/04 | 365/49.1 |
| 8,582,338 B1* | 11/2013 | Argyres | G11C 15/04 | 365/49.1 |
| 8,625,320 B1* | 1/2014 | Argyres | G11C 15/04 | 365/49.1 |
| 8,730,704 B1* | 5/2014 | Nataraj | H01L 27/1052 | 365/189.07 |
| 2003/0058671 A1* | 3/2003 | Lindahl | G11C 15/00 | 365/49.1 |
| 2004/0015651 A1* | 1/2004 | Chadwick | G11C 15/00 | 711/108 |
| 2004/0083421 A1* | 4/2004 | Foss | G06F 11/1064 | 714/805 |
| 2004/0093540 A1* | 5/2004 | Adams | G11C 29/40 | 714/718 |
| 2004/0100811 A1* | 5/2004 | Pereira | G11C 15/00 | 365/49.1 |
| 2005/0001744 A1* | 1/2005 | Roth | G11C 15/00 | 341/50 |
| 2005/0083725 A1* | 4/2005 | Regev | G11C 15/00 | 365/154 |
| 2005/0135135 A1* | 6/2005 | Sharma | G11C 15/04 | 365/49.15 |
| 2006/0120127 A1* | 6/2006 | Murakami | G11C 15/00 | 365/49.17 |
| 2006/0123327 A1* | 6/2006 | Foss | G06F 11/1064 | 714/800 |
| 2006/0256600 A1* | 11/2006 | Lee | G11C 15/04 | 365/49.1 |
| 2007/0247885 A1* | 10/2007 | Watanabe | G11C 15/04 | 365/49.17 |
| 2008/0005630 A1* | 1/2008 | Adsitt | G01R 31/31833 | 714/718 |
| 2008/0282135 A1* | 11/2008 | Santou | G06F 7/74 | 714/801 |
| 2010/0054012 A1* | 3/2010 | Srinivasan | G11C 15/00 | 365/49.17 |
| 2010/0328981 A1* | 12/2010 | Deshpande | G11C 15/04 | 365/49.17 |
| 2012/0327696 A1* | 12/2012 | Argyres | G11C 15/04 | 365/49.17 |

OTHER PUBLICATIONS

Sideris et al., Cost Effective Protection Techniques for TCAM Memory Arrays, Dec. 2012, IEEE, vol. 61, No. 12, pp. 1778-1788. (Year: 2012).*

* cited by examiner

Hamming Code Implementation for Parity Bit Coverage

| Bit Position | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Encoded Data Bits | p1 | p2 | d1 | p4 | d2 | d3 | d4 | p8 | d5 | d6 | d7 | d8 | d9 | d10 | d11 | p16 | d12 | d13 | d14 | d15 |
| Parity Bit Coverage p1 | x |  | x |  | x |  | x |  | x |  | x |  | x |  | x |  | x |  | x |  |
| p2 |  | x | x |  |  | x | x |  |  | x | x |  |  | x | x |  |  | x | x |  |
| p4 |  |  |  | x | x | x | x |  |  |  |  | x | x | x | x |  |  |  |  | x |
| p8 |  |  |  |  |  |  |  | x | x | x | x | x | x | x | x |  |  |  |  |  |
| p16 |  |  |  |  |  |  |  |  |  |  |  |  |  |  |  | x | x | x | x | x |

ERROR DETECTION AND CORRECTION CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional semiconductor fabrication designs, soft errors refer to a growing concern among memory designers, and error detection/correction codes are often used to mitigate these soft errors. However, the hardware overhead used to implement various error detection/correction schemes may limit the implementation of the same within some small area due to constraints placed on memory macros, which may be pushed to shared register transfer logic (RTL) within the system-on-a-chip (SoC). Conventional approaches of error correction codes (ECC) may use static random access memory (SRAM), wherein the ECC is performed only when data is read from memory. However, such a scheme may not be used in other types of memory structures, when data is used for searches. Memory design has included dedicated hardware to provide ECC, but this may unfortunately increase significant hardware overhead and may often result in performance penalties under normal operation.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 3 illustrates an embodiment of a Hamming code diagram for parity bit coverage in accordance with various implementations described herein.

DETAILED DESCRIPTION

Various implementations described herein are directed to error detection and correction circuitry for various scan chain applications. Some implementations described herein are directed to content-addressable memory (CAM) array architecture with efficient reuse of search logic for error detection and error correction. Thus, some implementations described herein allow the reuse of CAM search logic for computing error detection and correction checksums to mitigate soft errors.

Various implementations of error detection and correction circuitry will now be described in detail herein with reference to FIGS. 1A-4.

Figure 1A:
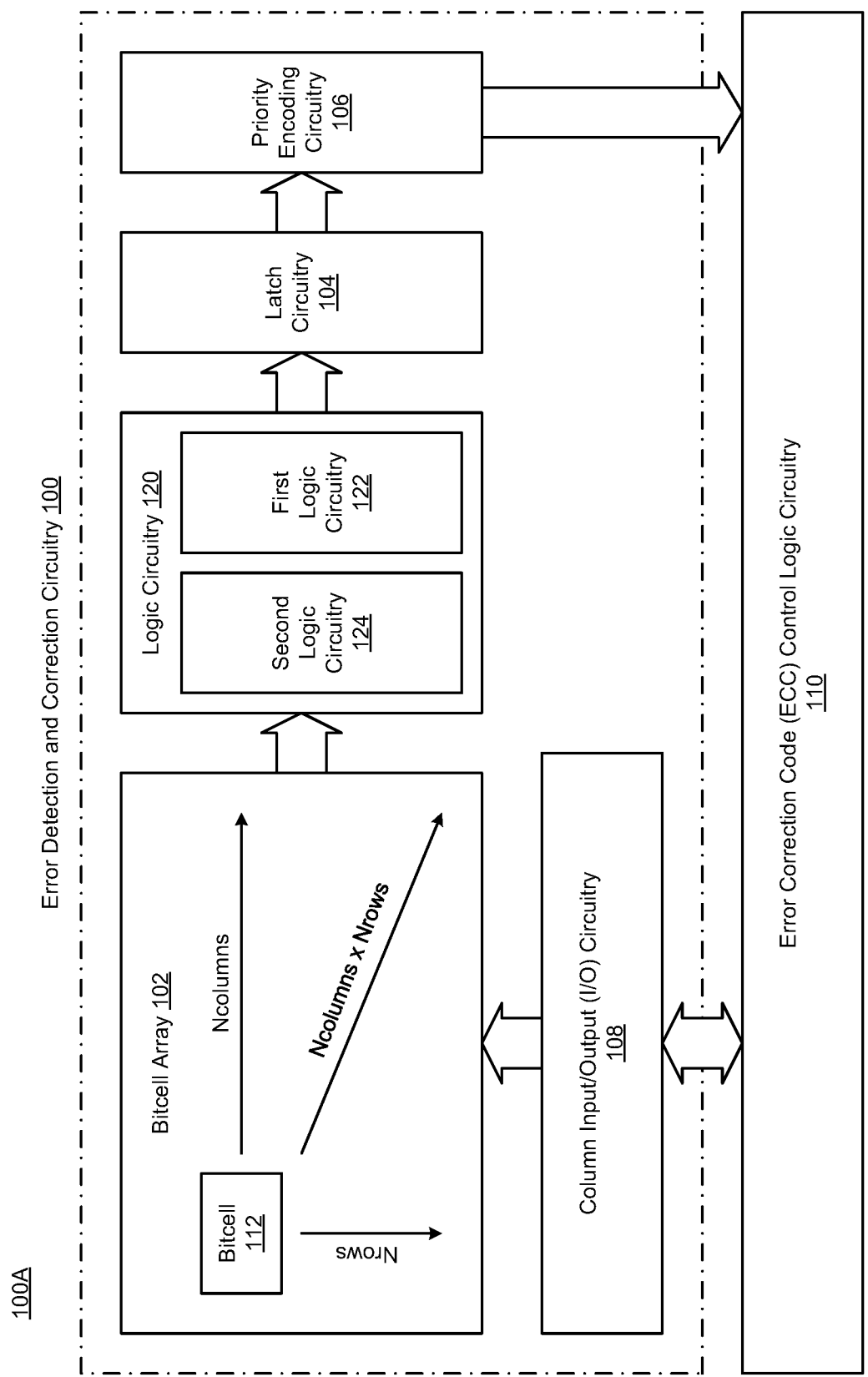
FIG. 1A illustrates a block diagram of error correction and detection circuitry in accordance with various implementations described herein.

FIG. 1A illustrates a diagram 100A of error correction and detection circuitry 100 in accordance with various implementations described herein. The error correction and detection circuitry 100 may include multiple components, such as a bitcell array 102, latch circuitry 104, priority encoding circuitry 106, and column input/output (I/O) circuitry 108. The error correction and detection circuitry 100 may also include logic circuitry 120 having first logic circuitry 122 and second logic circuitry 124. Further, error correction code (ECC) control logic circuitry 110 may be implemented to interface with the error correction and detection circuitry 100. These components 102, 104, 106, 108, 110, 120, 122, 124 may be coupled together to interface with each other and operate collectively to provide error detection and correction functionality for the circuitry 100 in various scan chain applications, as described herein. The error detection and correction circuitry 100 may be referred to simply as an error detection and correction circuit.

As shown in FIG. 1A, the bitcell array 102 may include an array of bitcells, such as, e.g., content-addressable memory (CAM) cells, including ternary CAM (TCAM) cells, binary CAM cells, or XY_CAM (data x, data y) cells. Also, the bitcell array 102 may include any number of bitcells 112 that are arranged in various configurations, such as, e.g., two-dimensional (2D) memory array (Ncolumns× Nrows) having any number (N) of columns (Ncolumns) and any number of rows (Nrows) of multiple bitcells 112, which may be arranged in a 2D grid pattern with 2D indexing capabilities. In general, each bitcell 112 may be referred to as a data-bitcell (or memory storage cell), and each bitcell 112 may be configured to store at least one data bit value (e.g., data value associated with a logical '0' or '1'). The bitcell array 102 may be referred to as a data-bitcell array.

The latch circuitry 104 may include one or more latches for each row of bitcells in the array of bitcells 102. For instance, the latch circuitry 104 may include a latch for each row of bitcells that is configured to latch valid match data into the latch for each row of bitcells in the array of bitcells 102.

The priority encoding circuitry 106 may receive the valid match data from the latch circuitry 104, such as, e.g., from each latch for each row of bitcells. The priority encoding circuitry 106 may provide an encoded address of a selected row of bitcells based on the valid match data received from each latch for each row of bitcells.

The logic circuitry 120 may include the first logic circuitry 122 which is coupled between the array of bitcells 102 and the priority encoding circuitry 106 so as to assist with providing the valid match data to the latch circuitry 104. This may include providing valid latch data for each latch for each row of bitcells. In some instances, the valid match data may refer to search data that matches memory data stored in one or more bitcells for each row of bitcells.

In some implementations, the first logic circuitry 122 may operate to translate (or transform) the latch circuitry 104 into parity accumulating circuitry, which may describe XOR functionality and/or implementation. In this instance, the priority encoding circuitry 106 may provide for parity evaluation and error detection via bit-by-bit (XOR) comparison and accumulation. Also, in this particular instance, the priority encoding circuitry 106 may be configured as a prioritizer for error detection and error correction.

As shown in FIG. 1A, the ECC control logic circuitry 110 communicates with the column I/O circuitry 108 and the priority encoding circuitry 106 so as to receive validity data and related information from the priority encoding circuitry 106 and control the flow of data from the bitcell array 102 via the column I/O circuitry 108. In some instances, this control mechanism allows the ECC control logic circuitry 110 to implement and control error detection and/or error correction for the circuitry 100.

In various implementations, the error correction and detection circuitry 100 may be implemented as an integrated circuit (IC) for various types of scan chain applications, using, e.g., TCAM bitcells and/or any other type of volatile memory. The error correction and detection circuitry 100 may be implemented as an IC with various dual rail memory architecture and related circuitry. Also, the error correction and detection circuitry 100 may be integrated with computing circuitry and related components on a single chip. The error correction and detection circuitry 100 may be implemented in embedded systems for electronic, mobile, IoT (Internet of things) applications.

Figure 1B:
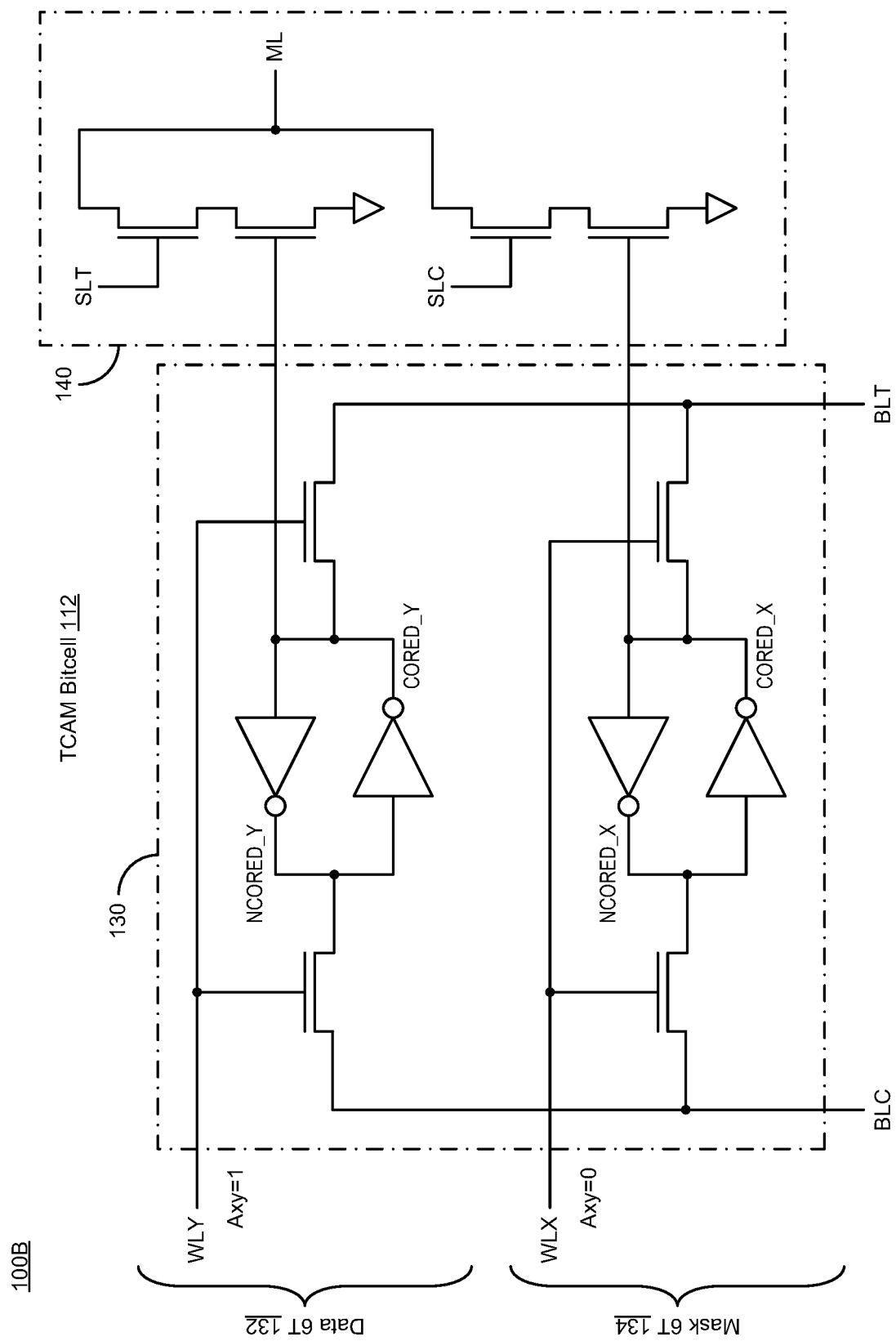
FIG. 1B illustrates a schematic diagram of memory cell circuitry in accordance with various implementations described herein.

FIG. 1B illustrates a schematic diagram 100B of memory cell circuitry 112 in accordance with various implementations described herein. In various implementations, the memory cell circuitry 112 may be embodied as a TCAM bitcell. In some instances, as shown in FIG. 1B, each bitcell 112 in the array of bitcells 102 may be implemented with TCAM bitcells. WLX/Y and BLC/T signal lines are used as inputs to the storage cells, and in one instance, an input signal (Axy) may be applied to the input WLX as a logic zero (0), and another input signal (Axy) may be applied to the input WLY as a logic one (1).

The TCAM bitcell 112 may include multiple components including memory logic 130 that is coupled to search logic 140. The memory logic 130 may be implemented with a data 6T bitcell 132 and a mask 6T bitcell 134 that are coupled together and provide output signals to the search logic 140. In some implementations, an output line for each row of bitcells 112 in the array of bitcells 102 of FIG. 1A refers to the match line (ML), and the latch circuitry 104 in FIG. 1A latches valid match data into each latch so that the match line (ML) for each row of bitcells is precharged.

As shown in FIG. 1B, WLX/Y and BLC/T signal lines are used to access the memory logic 130 of the TCAM bitcell 112 during read/write operations. The search logic 140 may be implemented, e.g., as a wired OR gate structure using multiple N-type metal-oxide-semiconductor (NMOS) transistors that are arranged in two NMOS stacks. In some implementations, the NMOS stacks in the search logic 140 may be used to compare the search data signals SLC/SLT with internal bitcell nodes of the data/mask bitcells 132, 134 to thereby decide whether the search is a hit or miss with a match line (ML) signal as per the truth tables 1, 2, 3 below for each TCAM bit and/or search bit.

Table 1 below refers to TCAM Data associated with a TCAM Bit.

TABLE 1

| TCAM Bit | CORED_X | CORED_Y |
|---|---|---|
| 0 | 0 | 1 |
| 1 | 1 | 0 |
| don't care | 0 | 0 |
| illegal | 1 | 1 |

Table 2 below refers to Search Data associated with a Search Bit.

TABLE 2

| Search Bit | SLT | SLC |
|---|---|---|
| 0 | 0 | 1 |
| 1 | 1 | 0 |
| don't care | 0 | 0 |
| illegal | 1 | 1 |

Table 3 below refers to Match Line (ML) Data associated with a ML bit.

TABLE 3

| ML | TCAM Bit | Search Bit |
|---|---|---|
| 0 | 0 | 1 |
| 0 | 1 | 0 |
| 1 | 0 | 0 |
| 1 | 1 | 1 |
| 1 | don't care | X |
| 1 | X | don't care |

In some implementations, if any of the data bits in a row of bitcells is a miss, the entire ML line (which is shared across the data word) goes low thus making a compare result a miss. If all bitcell data in a row of bitcells matches the input compare data, then ML line remains high and makes the result a HIT for that word. Further, a valid bit (or valid bit data) at the end of the data word may specify whether the data in the word is valid or invalid. In this instance, only valid word's search results are latched and passed on to the priority encoding circuitry 106 so as to generate the matching row address.

Figure 2A:
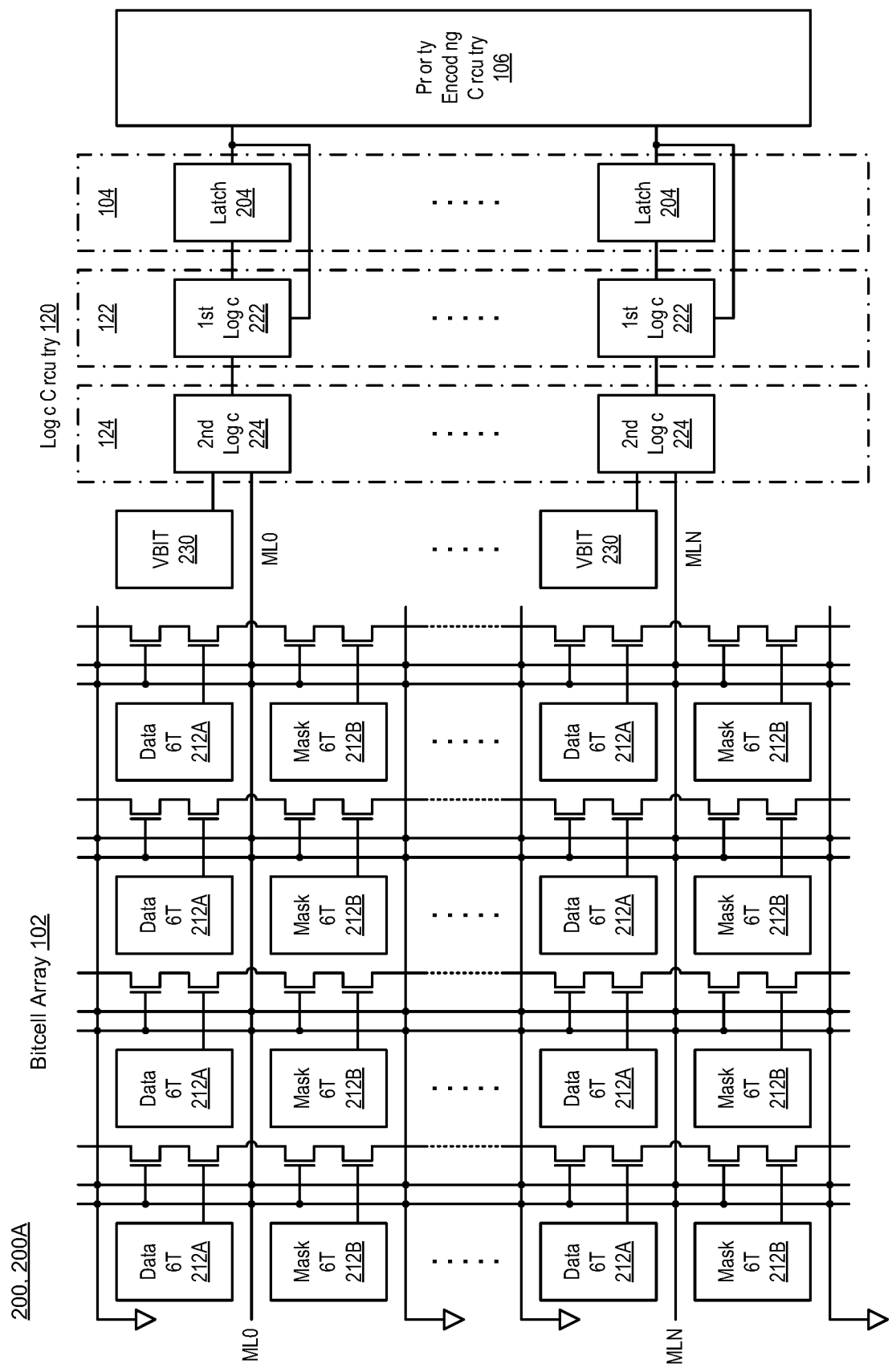
FIGS. 2A-2D illustrate various diagrams of error detection and error correction circuitry in accordance with various implementations described herein.
Figure 2B:
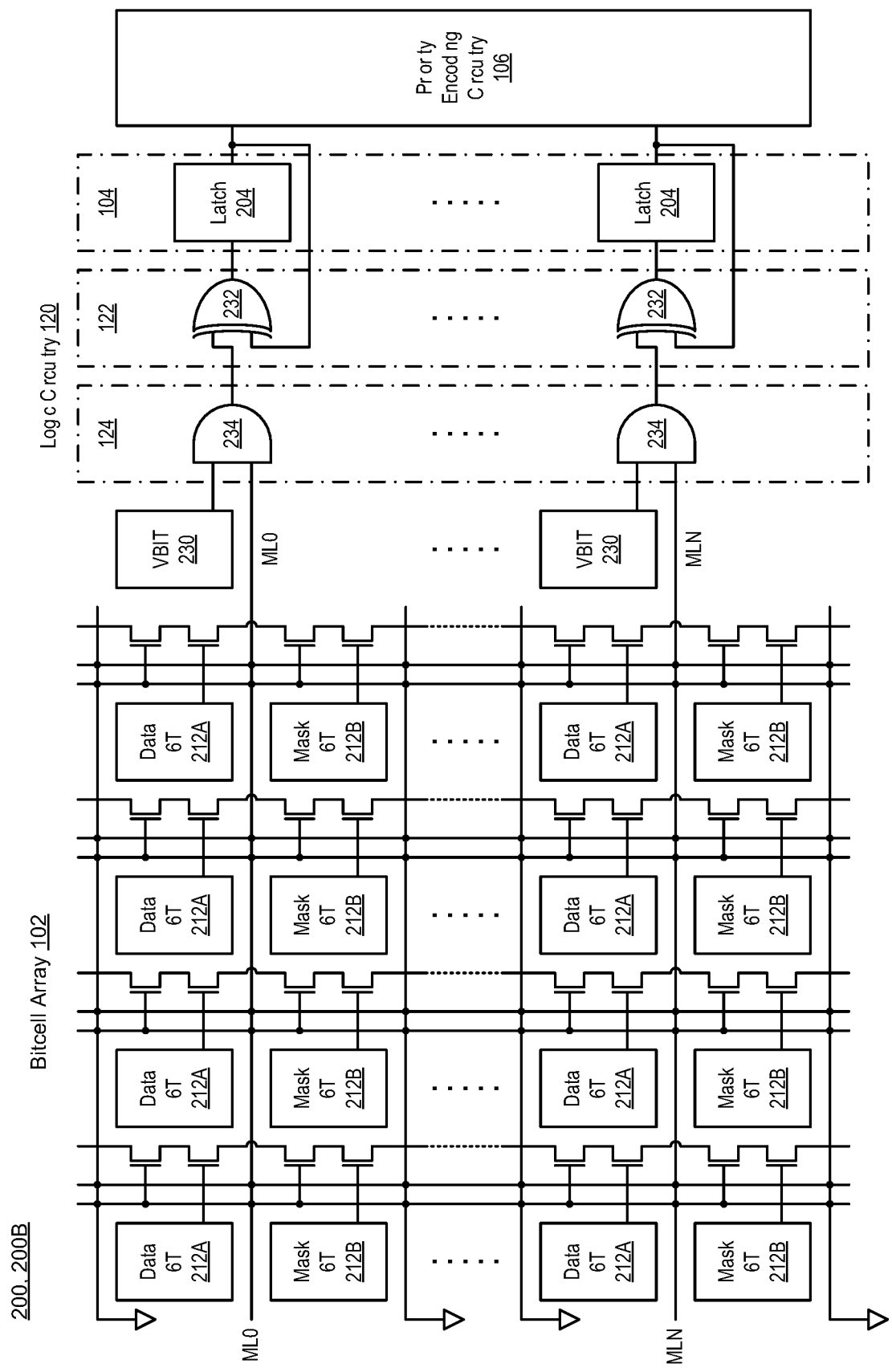
Figure 2C:
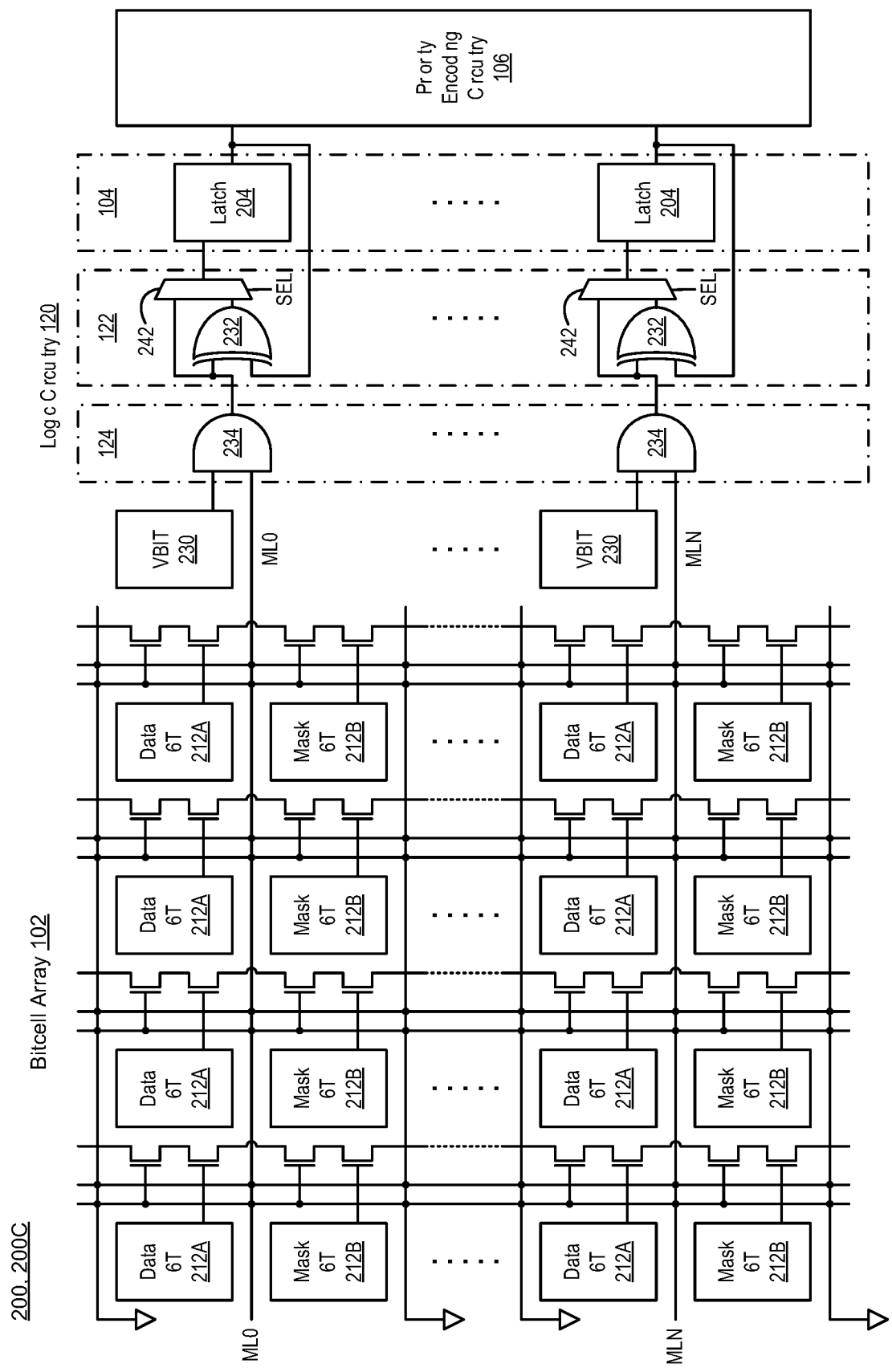
Figure 2D:
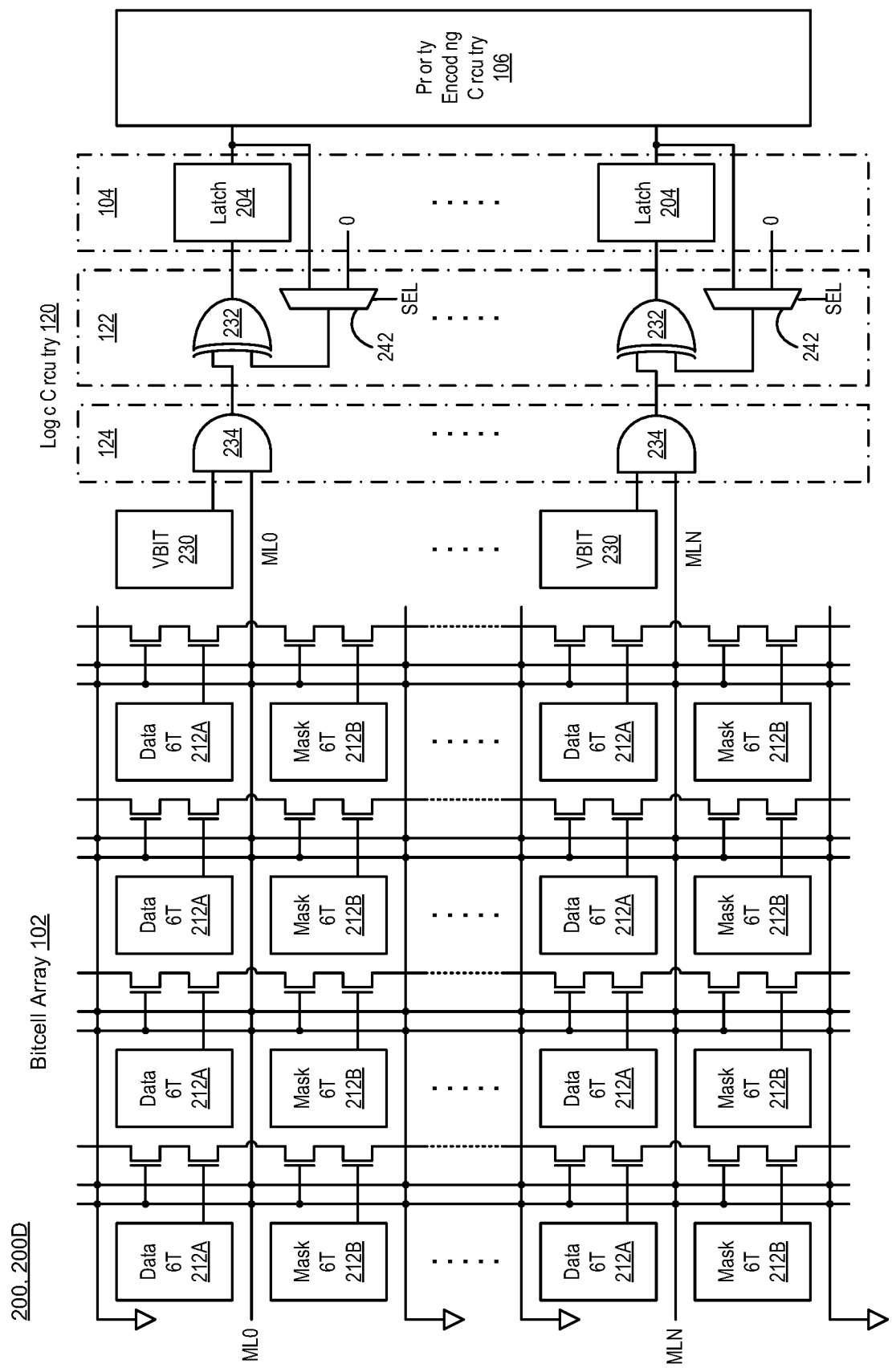

FIGS. 2A-2D illustrate various diagrams of error detection and correction circuitry 200 in accordance with various implementations described herein. In particular, FIG. 2A shows a first implementation 200A of error detection and correction circuitry 200, FIG. 2B shows a second implementation 200B of error detection and correction circuitry 200, FIG. 2C shows a third implementation 200C of error detection and correction circuitry 200, and FIG. 2D shows a fourth implementation 200D of error detection and correction circuitry 200. Various components in FIGS. 2A-2D are similar in scope, function, and operation as described in reference to the circuitry 100 shown in FIG. 1A and the TCAM bitcell 112 shown in FIG. 1B.

As shown in FIG. 2A, the error detection and correction circuitry 200 includes the array of bitcells 102 arranged in columns and rows. In some implementations, the bitcells 112 are embodied TCAM cells, e.g., as described in FIG. 1B. Thus, as shown, the array of bitcells 102 may include multiple rows of TCAM bitcells with each TCAM bitcell having a Data 6T cell 212A and Mask 6T cell 212B, and also, each row of TCAM bitcells corresponds to a match line (ML). In some other implementations, the bitcells 112 may be embodied with binary CAM cells, ternary CAM cells, or XY-CAM cells. In some instances, implementations described herein leave the array of bitcells 102 intact and convert the latch circuitry 104 into a XOR accumulator in an error detection/correction mode.

The circuitry 200 includes the latch circuitry 104 having a latch 204 for each row of bitcells having the corresponding match line (ML0, . . . , MLN) that latches valid match data into the latch 204 for each row of bitcells. In some implementations, the output line for each row of bitcells refers to the match line (ML0, . . . , MLN), and the latch circuitry 104 may be configured for latching valid match data into each latch 204 so that the match line (ML0, . . . , MLN) for each row of bitcells is precharged. In some instances, as shown, the latch circuitry 104 may include at least one latch 204 for each row of TCAM bitcells that latches valid match data into the at least one latch 204.

The circuitry 200 includes the priority encoding circuitry 106 that receives the valid match data from the latch 204 for each row of bitcells. In some implementations, the priority encoding circuitry 106 provides an encoded address of a selected row of bitcells based on the valid match data received from each latch 204. The priority encoding circuitry 106 may provide for parity evaluation and error detection via bit-by-bit (XOR) comparison and accumulation. In this instance, the priority encoding circuitry 106 may be implemented as a prioritizer for error detection and/or error correction. In some instances, as shown, the priority encoding circuitry 106 receives the valid match data from each latch 204.

The circuitry 200 includes the first logic circuitry 122 coupled between the array of bitcells 102 and the priority encoding circuitry 106 so as to assist with providing the valid match data to the latch circuitry 104. As described herein above, the valid match data may refer to search data that matches memory data stored in one or more bitcells 112 for each row of bitcells. The first logic circuitry 122 may translate the latch circuitry 104 into parity accumulating circuitry, which describes XOR implementation.

In some implementations, the first logic circuitry 122 may include first logic 222 that is coupled between each row of TCAM bitcells and the latch 204 so as assist with providing the valid match data to the latch 204. The first logic 222 of the first logic circuitry 122 may be embodied with a logic gate (i.e., first logic gate), and as shown in FIG. 2B, the first logic (gate) 222 of the first logic circuitry 122 may be embodied with an XOR gate 232. In other implementations, as shown in FIG. 2C, the first logic (gate) 222 of the first logic circuitry 122 may be embodied with the XOR gate 232 and a multiplexor 242 (in a first configuration) that is operable with a select signal (SEL). In other implementations, as shown in FIG. 2D, the first logic (gate) 222 of the first logic circuitry 122 may be embodied with the XOR gate 232 and the multiplexor 242 (in a second configuration) that is operable with the select signal (SEL).

The circuitry 200 includes valid-bit (VBIT) circuitry 230 for each row of bitcells for indicating that valid data is stored in each row of bitcells, and the valid-bit (VBIT) circuitry 230 provides the valid data to the latch circuitry 104. As shown, the first logic circuitry 122 is coupled between the valid-bit (VBIT) circuitry 230 and the latch circuitry 104 so as to assist with providing the valid match data to the latch circuitry 104.

The circuitry 200 includes the second logic circuitry 124 that is coupled to each row of bitcells, and as shown, the first logic circuitry 122 is coupled between the second logic circuitry 124 and the latch circuitry 104. In some implementations, the second logic circuitry 124 may include second logic 224 that is coupled between each row of TCAM bitcells and the first logic circuitry 122 (and also the latch 204) so as assist with providing the valid match data to the latch 204. As shown, the second logic 224 of the second logic circuitry 124 may be embodied with a logic gate (i.e., second logic gate) for each row of TCAM bitcells, and as shown in FIGS. 2B-2D, the second logic (gate) 224 of the second logic circuitry 124 may be embodied with an AND gate 234.

In some implementations, as shown in FIGS. 2A-2D, the second logic (gate) 224 may be coupled between each row of TCAM bitcells and the first logic (gate) 222 to thereby assist with providing the valid match data to the latch 204 for each row of TCAM bitcells. In this instance, the valid-bit circuitry 230 for each row of TCAM bitcells may be used to indicate that valid data is stored in each row of TCAM bitcells, and as shown, the valid-bit circuitry 230 may be coupled to the latch 204 and provide the valid data to the second logic (gate) 224 for each row of TCAM bitcells. In some instances, the second logic (gate) 224 for each row of TCAM bitcells is coupled between the valid-bit circuitry 230 and the first logic (gate) 222 for each row of TCAM bitcells. In other instances, the first logic (gate) 222 for each row of TCAM bitcells may be coupled between the second logic (gate) 224 and the latch 204 for the row of TCAM bitcells.

In reference to FIG. 2A, the output of the latch 204 is fed back to the first logic (gate) 222, and thus, the first logic (gate) 222 provides output based on receiving the output from the second logic (gate) 224 and the output from the latch 204.

In reference to FIG. 2B, the output of the latch 204 is fed back to the first logic XOR gate 232, and thus, the first logic XOR gate 232 provides output based on receiving the output from the second logic AND gate 234 and the output from the latch 204.

In reference to FIG. 2C, the output of the latch 204 is fed back to the first logic XOR gate 232, and thus, the first logic XOR gate 232 provides output based on receiving the output from the second logic AND gate 234 and the output from the latch 204. Further, as shown in first configuration of the MUX 242 in FIG. 2C, the MUX 242 provides output based on receiving the output from the second logic AND gate 234 and the output from the first logic XOR gate 232 based on the select signal (SEL).

In reference to the second configuration of the MUX 242 in FIG. 2D, the output of the latch 204 is fed back to the first logic XOR gate 232 via the MUX 242. As shown in FIG. 2D, the MUX 242 provides output based on receiving the output from the latch 204 and a logic zero (0) input (e.g., a ground signal) based on the select signal (SEL). Further, as shown in FIG. 2D, the first logic XOR gate 232 provides output based on receiving the output from the second logic AND gate 234 and the output from the MUX 242.

In some implementations, XOR path may be enabled only in an error detection code (EDC) evaluation mode and/or an error correction code (ECC) evaluation mode. In EDC/ECC evaluation mode, checking parity of data may be ON (at any given time in only one of the SLT lines (e.g., SLT0)), and it acts similarly as reading a wordline. For instance, if the data is zero (0), then checking parity may discharge the corresponding ML line, and the SLC lines may be pulled low to isolate adjacent rows. This operation may be repeated for each of the SLT lines for data parity in multiple clock cycles, while each time XORing the ML output with a previous partial XOR result, until XORing all the bits is completed. The final parity data may be passed through the priority encoding circuitry 106 to thereby identify which specific row of bitcells may have an error.

FIG. 3 illustrates a Hamming Code diagram 300 for parity bit coverage in accordance with various implementations described herein.

In some implementations, as shown in FIG. 3, the Hamming code diagram 300 involves adding multiple parity bits at different bit locations of the data word. For instance, each of the parity bit checks provides parity for specific subset bits of the data word, as shown in FIG. 3. In this instance, p1 may be used to check for one or more or all odd indexed bit positions.

In some implementations, the Hamming Code operation may be repeated for each of the parity bits while adjusting the SLT sequence to access only the required bits corresponding to that parity bit. The data word address (where the parity fails) may be generated by the prioritizer block (i.e., priority encoding circuitry 106), which is part of the CAM. The data word address corresponding to each of the parity bits may be combined outside the CAM to point to a specific bit where the error has occurred. Similar hardware may be extended to SECDED coding (i.e., single error correction—double error detection) as it's similar to Hamming code along with an additional party bit. In some instances, to check the parity on the Mask data word, the Hamming Code operation may be repeated by accessing SLC lines while SLT is tied to low, such as, e.g., ground (GND, VSS) or a ground voltage source.

Various implementations described herein provide various advantages. For instance, schemes and techniques described herein provide an approach that efficiently reuses the hardware with minimal overhead to thereby implement full error detection and correction through parity, Hamming Code, SECDED coding, or any other related coding system that relies on bitwise XOR. Further, XOR accumulation may be replaced with any other logic to extend the application. In schemes and techniques described herein, the total number of cycles required for ECC to cover full array may equal the number of bits. In schemes and techniques described herein, the hardware may equal one XOR accumulator times (i.e., multiplied) the number of data words. Further, in schemes and techniques described herein, because of shared match line (ML) output across the bit width, it may be easier to use one XOR accumulator per data word. Moreover, schemes and techniques described herein is associated with the advantage of providing area efficiency.

Figure 4:
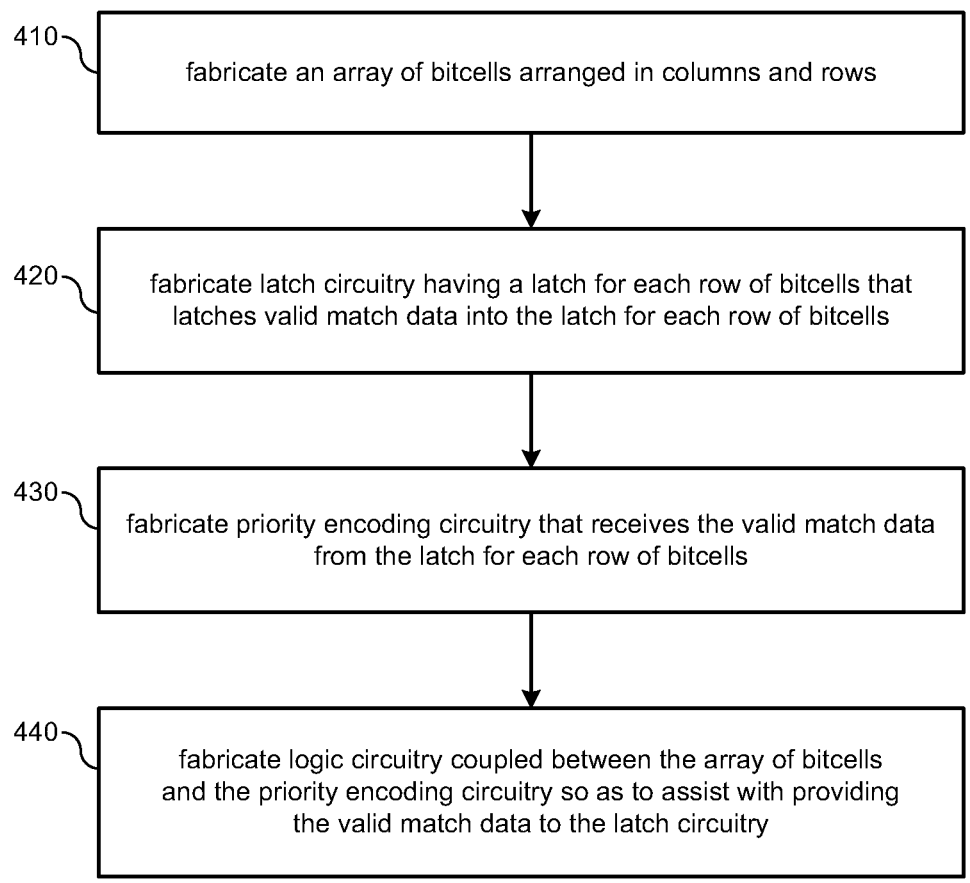
FIG. 4 illustrates a process flow diagram of a method for manufacturing an integrated circuit in accordance with various implementations described herein.

FIG. 4 illustrates a process flow diagram of a method 400 for manufacturing an integrated circuit in accordance with various implementations described herein.

It should be understood that even though method 400 may indicate a particular order of operation execution, various certain portions of operations may be executed in a different order, and on different systems. Also, additional operations and/or steps may be added to and/or omitted from method 400. In various implementations, method 400 may be implemented in hardware and/or software. For instance, if implemented in hardware, method 400 may be implemented with various circuit components, as described herein in reference to FIGS. 1A-3. Otherwise, if implemented in software, method 400 may be implemented as a program and/or software instruction process that is configured for error detection and correction circuitry for various scan chain applications. Also, if implemented in software, instructions related to method 400 may be stored in non-transitory memory and/or a database. For instance, a computer or various other types of computing devices having a processor and memory may be configured to perform method 400.

As described and shown in reference to FIG. 4, method 400 may be used for manufacturing an integrated circuit (IC) that implements error detection and/or correction circuitry in various types of scan chain applications, such as, e.g., TCAM applications.

At block 410, method 400 may fabricate an array of bitcells arranged in columns and rows. In various implementations, bitcells in the array of bitcells may include various types of memory storage cells, such as, e.g., content-addressable memory (CAM) cells, binary CAM cells, ternary CAM cells, or XY-CAM cells.

At block 420, method 400 may fabricate latch circuitry having a latch for each row of bitcells that latches valid match data into the latch for each row of bitcells. In some instances, the valid match data may refer to search data that matches memory data stored in one or more bitcells for each row of bitcells. In some instances, an output line for each row of bitcells may include a match line (ML), and the latch circuitry latches valid match data into each latch so that the match line for each row of bitcells is precharged.

At block 430, method 400 may fabricate priority encoding circuitry that receives the valid match data from the latch for each row of bitcells. The priority encoding circuitry may provide an encoded address of a selected row of bitcells based on the valid match data received from each latch. In some implementations, the priority encoding circuitry may provide for parity evaluation and error detection via bit-by-bit (XOR) comparison and accumulation. In other implementations, the priority encoding circuitry may be embodied as a prioritizer for error detection and error correction.

At block 440, method 400 may fabricate logic circuitry (i.e., first logic circuitry) that is coupled between the array of bitcells and the priority encoding circuitry so as to assist with providing the valid match data to the latch circuitry. In some implementations, the first logic circuitry may translate the latch circuitry into parity accumulating circuitry, which describes an XOR implementation.

In some implementations, method 400 may include fabricating valid-bit circuitry for each row of bitcells for indicating that valid data is stored in each row of bitcells, and the valid-bit circuitry may provide the valid data to the latch circuitry. The first logic circuitry may be coupled between the valid-bit circuitry and the latch circuitry to thereby assist with providing the valid match data to the latch circuitry. Method 400 may include fabricating second logic circuitry that is coupled to each row of bitcells, and the first logic circuitry may be coupled between the second logic circuitry and the latch circuitry.

In some implementations, the first logic circuitry may include a first logic gate, and the first logic gate may include an XOR gate. The second logic circuitry may include a second logic gate for each row of bitcells, and the second logic gate may include an AND gate. The second logic gate may be coupled between each row of bitcells and the first logic gate so as to assist with providing the valid match data to the latch for each row of bitcells. The valid-bit circuitry may be coupled to the latch and provide the valid data to the second logic gate for the row of bitcells. Further, the second logic gate for each row of bitcells may be coupled between the valid-bit circuitry and the first logic gate for each row of bitcells. The first logic gate for each row of bitcells may be coupled between the second logic gate and the latch for each row of bitcells.

Described herein are various implementations of an integrated circuit. The integrated circuit may include an array of bitcells arranged in columns and rows. The integrated circuit may include latch circuitry having a latch for each row of bitcells that latches valid match data into the latch for each row of bitcells. The integrated circuit may include priority encoding circuitry that receives the valid match data from the latch for each row of bitcells. The integrated circuit may include first logic circuitry coupled between the array of bitcells and the priority encoding circuitry to assist with providing the valid match data to the latch circuitry.

Described herein are various implementations of an integrated circuit. The integrated circuit may include a row of ternary content-addressable memory (TCAM) bitcells. The integrated circuit may include a latch for the row of TCAM bitcells that latches valid match data into the latch. The integrated circuit may include a logic gate coupled between the row of TCAM bitcells and the latch to assist with providing the valid match data to the latch. The integrated circuit may include a priority encoder that receives the valid match data from the latch.

Described herein are various implementations of a method for manufacturing or fabricating an integrated circuit. The method may include fabricating an array of bitcells arranged in columns and rows. The method may include fabricating latch circuitry having a latch for each row of bitcells that latches valid match data into the latch for each row of bitcells. The method may include fabricating priority encoding circuitry that receives the valid match data from the latch for each row of bitcells. The method may include fabricating logic circuitry coupled between the array of bitcells and the priority encoding circuitry to assist with providing the valid match data to the latch circuitry.

The above referenced summary section is provided to introduce a selection of concepts in a simplified form that are further described above in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
an array of bitcells arranged in columns and rows;
latch circuitry having a latch for each row of bitcells that latches valid match data into the latch for each row of bitcells;
priority encoding circuitry that
receives the valid match data from the latch for each row of bitcells; and
first logic circuitry comprising an XOR gate coupled between the array of bitcells and the priority encoding circuitry to assist with providing the valid match data to the latch circuitry by providing valid latch data and/or valid search data.

2. The integrated circuit of claim 1, wherein the bitcells comprise content-addressable memory (CAM) cells, binary CAM cells, ternary CAM cells, or XY-CAM cells.

3. The integrated circuit of claim 1, wherein the valid match data refers to search data that matches memory data stored in one or more bitcells for each row of bitcells.

4. The integrated circuit of claim 1, wherein an output line for each row of bitcells comprises a match line, and wherein the latch circuitry latches the valid match data into each latch so that the match line for each row of bitcells is precharged.

5. The integrated circuit of claim 1, wherein the priority encoding circuitry provides an encoded address of a selected row of bitcells based on the valid match data received from each latch.

6. The integrated circuit of claim 1, further comprising valid-bit circuitry for each row of bitcells for indicating that valid data is stored in each row of bitcells, and wherein the valid-bit circuitry provides the valid data to the latch circuitry.

7. The integrated circuit of claim 6, wherein the first logic circuitry is coupled between the valid-bit circuitry and the latch circuitry to assist with providing the valid match data to the latch circuitry.

8. The integrated circuit of claim 6, further comprising second logic circuitry coupled to each row of bitcells, and wherein the first logic circuitry is coupled between the second logic circuitry and the latch circuitry.

9. The integrated circuit of claim 1, wherein the first logic circuitry translates the latch circuitry into parity accumulating circuitry.

10. The integrated circuit of claim 1, wherein the priority encoding circuitry provides for parity evaluation and error detection via bit-by-bit comparison and accumulation.

11. The integrated circuit of claim 1, wherein the priority encoding circuitry comprises a prioritizer for error detection and error correction.

12. An integrated circuit, comprising:
- a row of ternary content-addressable memory (TCAM) bitcells;
- a latch for the row of TCAM bitcells that latches valid match data into the latch;
- a logic gate comprising a first logic gate that comprises an XOR gate coupled between the row of TCAM bitcells and the latch to assist with providing the valid match data to the latch by providing valid latch data and/or valid search data; and
- a priority encoder that
  receives the valid match data from the latch.

13. The integrated circuit of claim 12, further comprising a second logic gate for the row of TCAM bitcells, and wherein the second logic gate comprises an AND gate.

14. The integrated circuit of claim 13, wherein the second logic gate is coupled between the row of TCAM bitcells and the first logic gate to assist with providing the valid match data to the latch for the row of TCAM bitcells.

15. The integrated circuit of claim 13, further comprising a valid-bit circuit for the row of TCAM bitcells for indicating that valid data is stored in the row of TCAM bitcells, and wherein the valid-bit circuit is coupled to the latch and provides the valid data to the second logic gate for the row of TCAM bitcells.

16. The integrated circuit of claim 15, wherein the second logic gate for the row of TCAM bitcells is coupled between the valid-bit circuit and the first logic gate for the row of TCAM bitcells.

17. The integrated circuit of claim 13, wherein the first logic gate for the row of TCAM bitcells is coupled between the second logic gate and the latch for the row of TCAM bitcells.

18. The integrated circuit of claim 12, wherein the priority encoder comprises a prioritizer for error detection and error correction.

19. A method for manufacturing an integrated circuit, comprising:
- fabricating an array of bitcells arranged in columns and rows;
- fabricating latch circuitry having a latch for each row of bitcells that latches valid match data into the latch for each row of bitcells;
- fabricating priority encoding circuitry that
  receives the valid match data from the latch for each row of bitcells; and
- fabricating logic circuitry comprising a first logic gate that comprises an XOR gate coupled between the array of bitcells and the priority encoding circuitry to assist with providing the valid match data to the latch circuitry by providing valid latch data and/or valid search data.

* * * * *